(12) United States Patent
Mueller et al.

(10) Patent No.: US 11,169,209 B2
(45) Date of Patent: Nov. 9, 2021

(54) CIRCUIT ARRANGEMENT FOR EVALUATING AT LEAST TWO SWITCHING STATES OF AN ACTUATING ELEMENT, METHOD FOR OPERATING A CIRCUIT ARRANGEMENT AND SWITCHING DEVICE

(71) Applicant: Valeo Schalter und Sensoren GmbH, Bietigheim-Bissingen (DE)

(72) Inventors: Stefan Mueller, Bietigheim-Bissingen (DE); Raphael Mack, Bietigheim-Bissingen (DE)

(73) Assignee: Valeo Schalter und Sensoren GmbH, Bietigheim-Bissingen (DE)

( * ) Notice: Subject to any disclaimer, the term of this patent is extended or adjusted under 35 U.S.C. 154(b) by 149 days.

(21) Appl. No.: 16/624,689

(22) PCT Filed: Jun. 19, 2018

(86) PCT No.: PCT/EP2018/066160
§ 371 (c)(1),
(2) Date: Dec. 19, 2019

(87) PCT Pub. No.: WO2018/234259
PCT Pub. Date: Dec. 27, 2018

(65) Prior Publication Data
US 2020/0132770 A1   Apr. 30, 2020

(30) Foreign Application Priority Data

Jun. 23, 2017   (DE) .......................... 102017113905

(51) Int. Cl.
*G01R 31/327* (2006.01)
*G01R 31/50* (2020.01)
(Continued)

(52) U.S. Cl.
CPC ............ *G01R 31/327* (2013.01); *G01R 31/50* (2020.01); *H01H 3/0213* (2013.01); *H01H 9/16* (2013.01);
(Continued)

(58) Field of Classification Search
CPC ...... G01R 31/00; G01R 31/327; G01R 31/50; H01H 3/00; H01H 3/02; H01H 3/0213;
(Continued)

(56) References Cited

U.S. PATENT DOCUMENTS 3,854,080 A * 12/1974 Bambara ................. G03B 21/32
                                                            318/436
4,492,821 A *  1/1985 Kopetzky ............ H04M 3/2272
                                                            379/27.01
(Continued)

FOREIGN PATENT DOCUMENTS

DE   102006038375 A1   2/2008
DE   102009056283 A1   6/2011
(Continued)

OTHER PUBLICATIONS

International Search Report and Written Opinion corresponding to International Application No. PCT/EP2018/066160, dated Apr. 8, 2019 (12 pages).
(Continued)

*Primary Examiner* — Hoai-An D. Nguyen
(74) *Attorney, Agent, or Firm* — Osha Bergman Watanabe & Burton LLP

(57) ABSTRACT

The invention relates to a circuit arrangement (100) for evaluating at least two switching states of an actuating element, having a moveable contact means (110) which is connectable to the actuating element, a first evaluation circuit (140*a*) with a first voltage divider, which has first node points (K1*a*, K2*a*, K3*a*, K4*a*, K5*a*) and a first tap
(Continued)

Figure 1:
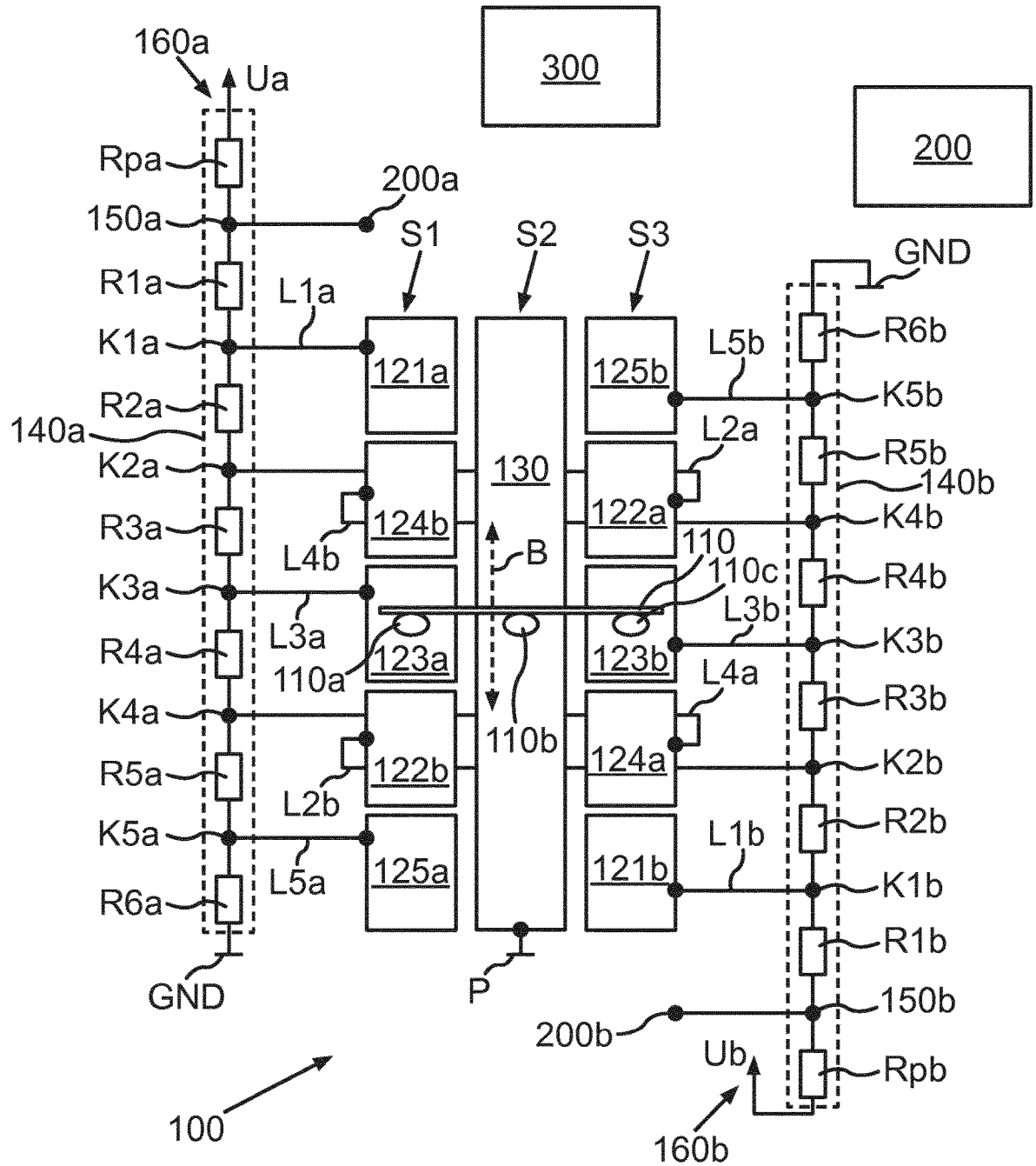

(150a) for tapping off a first output signal (A1, A3, A5) of the first evaluation circuit (140a), at least one second evaluation circuit (140b) with a second voltage divider, which has second node points (K1b, K2b, K3b, K4b, K5b) and a second tap (150a) for tapping off a second output signal (A2, A4, A6) of the second evaluation circuit (140b), first contact surfaces (121a, 122a, 123a, 124a, 125a) which are each electrically connected to one of the first node points (K1a to K5a), and second contact surfaces (121b, 122b, 123b, 124b, 125b) which are each electrically connected to one of the second node points (K1b to k5b), wherein via the movable contact means (110), depending on the switching state of the actuating element at least one of the first contact surfaces (121a to 125a) and/or at least one of the second contact surfaces (121b and 125b) are electrically connectable to a predetermined reference potential (P). The invention also relates to a method for operating a circuit arrangement (100), and to a switching device having a circuit arrangement (100).

14 Claims, 3 Drawing Sheets

(51) Int. Cl.
*H01H 9/54* (2006.01)
*H01H 9/16* (2006.01)
*H01H 3/02* (2006.01)

(52) U.S. Cl.
CPC ......... *H01H 9/54* (2013.01); *H01H 2239/012* (2013.01)

(58) Field of Classification Search
CPC .. H01H 9/00; H01H 9/16; H01H 9/54; H01H 2239/00; H01H 2239/01; H01H 2239/012
USPC ............ 324/415–424; 361/1, 93.1, 101, 102, 361/103, 435
See application file for complete search history.

(56) References Cited

U.S. PATENT DOCUMENTS

| | | | | |
|---|---|---|---|---|
| 6,127,694 | A * | 10/2000 | Nakajima | G01R 31/2884 257/48 |
| 7,471,527 | B2 * | 12/2008 | Chen | H02M 3/33523 363/65 |
| 7,535,131 | B1 * | 5/2009 | Safieh, Jr. | H03K 5/1254 307/134 |
| 2006/0017445 | A1 * | 1/2006 | Flock | H02H 5/10 324/503 |
| 2015/0333502 | A1 * | 11/2015 | Prexl | H02H 7/1213 361/18 |

FOREIGN PATENT DOCUMENTS

| | | |
|---|---|---|
| DE | 102010048750 A1 | 4/2012 |
| DE | 102014117417 A1 | 6/2016 |
| WO | 2008/017351 A1 | 2/2008 |

OTHER PUBLICATIONS

German Search Report issued in corresponding German Application No. 10 2017 113 905.2, dated Feb. 7, 2018 (5 pages).

* cited by examiner

CIRCUIT ARRANGEMENT FOR EVALUATING AT LEAST TWO SWITCHING STATES OF AN ACTUATING ELEMENT, METHOD FOR OPERATING A CIRCUIT ARRANGEMENT AND SWITCHING DEVICE

The invention relates to a circuit arrangement for evaluating at least two switching states of an actuating element, having a moveable contact means which is connectable to the actuating element, a first evaluation circuit with a first voltage divider, which has first node points and a first tap for tapping off a first output signal of the first evaluation circuit, at least one second evaluation circuit with a second voltage divider, which has second node points and a second tap for tapping off a second output signal of the second evaluation circuit, first contact surfaces which are each electrically connected to one of the first node points, and second contact surfaces which are each electrically connected to one of the second node points, wherein via the movable contact means, depending on the switching state of the actuating element at least one of the first contact surfaces and/or at least one of the second contact surfaces are electrically connectable to a predetermined reference potential (P). The invention also relates to a method for operating a circuit arrangement and to a switching device having a circuit arrangement.

Arrangements for the evaluation of circuit switching states or positions of actuating elements are already known from the prior art. Such actuating elements can be provided in a motor vehicle and implemented in the form of switches, such as a steering column switch, which can be used for indicating a direction of travel or for controlling a windscreen wiper system of the motor vehicle. It is also known to perform the evaluation of the switching state of the actuating element by digital or analogue means. To do this, the already known circuit arrangements have a movable contact means which is mechanically connected to the actuating element. Using this contact means of the actuating element, different node points of an evaluation circuit of the circuit arrangement are connected to each other and/or to a reference potential depending on the respective switching state of the actuating element. This causes a change in an output signal from the evaluation circuit depending on the switch position.

In the analogue evaluation of the switching states it is possible, for example due to a deteriorating contact quality between the contact means and contact surfaces of the evaluation circuit that interact with the contacting means, that an incorrect evaluation can occur. A deterioration of the contact quality can be caused, for example, by material wear, contact contamination or contact corrosion, and can lead to a change in the contact resistance between the contact means and the contact surface, thereby causing a change in the output signal. If this modified output signal is assigned to a switch position other than that actually present, then this can lead to an incorrect interpretation/evaluation of this switch position. This is particularly problematic in the case of safety-critical applications. If the switching state of a switch of a direction indicator or turn indicator is misinterpreted such that a flashing signal is issued in the direction other than that selected by the driver, this can result in danger to the driver and other road users.

In order to increase the safety of a circuit arrangement with respect to false evaluations, specification WO 2008/0173511 A1 proposes to equip the circuit arrangement with two evaluation circuits, wherein certain switching states are evaluated only by the first evaluation circuit and certain switching states are evaluated only by the second evaluation circuit. For example, in the case of a direction indicator the first evaluation circuit can only detect those switching states corresponding to a first travel direction and the second evaluation circuit only those switching states corresponding to a second travel direction.

In this circuit arrangement, however, the diagnostic ability and robustness to commonly occurring failure or fault types on the circuit arrangement are no longer sufficient, in particular to satisfy the latest requirements of automobile manufacturers in this respect.

For example, in the known circuit arrangement faults in the form of short circuits between two mechanically adjacent contact surfaces cannot be reliably detected. However, since the design of the contact surfaces means that they are arranged very close to one another, that is to say separated by a small insulating distance, short circuits cannot be prevented with sufficient reliability, for example due to abrasion, condensation, dirt or other conductive foreign bodies. The fault detection rate is even further limited if a short circuit occurs between a contact surface on the first evaluation circuit and a contact surface on the second evaluation circuit. In addition, the fault detection rate is limited even further if not only pure short-circuits are taken into account, i.e. contact resistances with a value of approximately 0 Ohms, but also soft shorts, i.e. any parasitic resistances between two contact surfaces.

The object of the present invention is to implement a particularly reliable circuit arrangement for the evaluation of switching states of an actuating element, which is optimized in terms of a fault diagnosis capability.

This object is achieved according to the invention by means of a circuit arrangement, a method for operating a circuit arrangement and a switching device in accordance with the respective independent claims. Advantageous embodiments of the invention are the subject matter of the dependent claims, the description and the figures.

In one aspect of a circuit arrangement according to the invention for evaluating at least two switching states of an actuating element, this has, in particular, a moveable contact means which is connectable to the actuating element, a first evaluation circuit with a first voltage divider which has first node points and a first tap for tapping off a first output signal of the first evaluation circuit, and at least one second evaluation circuit with a second voltage divider which has second node points and a second tap for tapping off a second output signal of the second evaluation circuit. In particular, the circuit arrangement also has first contact surfaces which are each electrically connected to one of the first node points, and second contact surfaces which are each electrically connected to one of the second node points, wherein via the movable contact means, depending on the switching state of the actuating element, at least one of the first contact surfaces and/or at least one of the second contact surfaces are electrically connectable to a predetermined reference potential. In particular, the evaluation circuits are designed to be switched on and off separately from each other, wherein the circuit arrangement is designed to detect the switching state of the actuating element on the basis of the output signal of a connected evaluation circuit, and to carry out a fault diagnosis of the circuit arrangement on the basis of the output signal of a deactivated evaluation circuit.

Particularly preferably, a circuit arrangement for evaluating at least two switching states of an actuating element has a moveable contact means which is connectable to the actuating element, a first evaluation circuit with a first voltage divider which has first node points and a first tap for tapping off a first output signal of the first evaluation circuit, and at least one second evaluation circuit with a second voltage divider which has second node points and a second tap for tapping off a second output signal of the second evaluation circuit. In addition, the circuit arrangement has first contact surfaces which are each electrically connected to one of the first node points, and second contact surfaces which are each electrically connected to one of the second node points, wherein via the movable contact means, depending on the switching state of the actuating element at least one of the first contact surfaces and/or at least one of the second contact surfaces are electrically connectable to a predetermined reference potential. In addition, the evaluation circuits are designed to be switched on and off separately from each other, wherein the circuit arrangement is designed to detect the switching state of the actuating element on the basis of the output signal of a connected evaluation circuit, and on the basis of the output signal of a deactivated evaluation circuit to carry out a fault diagnosis of the circuit arrangement.

The circuit arrangement can be used, for example, to evaluate the switching state or a position of the actuating element in a motor vehicle. The actuating element mounted on the motor vehicle can be designed, for example, as a switch in the form of a steering column switch. To detect or evaluate a position of the actuating element in a switching state selected by a person operating the actuating element, the circuit arrangement comprises the contact means and the evaluation circuits. The contact means, in the condition in which it is mechanically connected to the actuating element, can be moved in particular together with the actuating element. The circuit arrangement and the actuating element which is connected, in particular mechanically, to the movable contact means, can thus form a switching device.

Each evaluation circuit comprises the voltage divider having the respective node points, wherein the voltage dividers have the respective tap for tapping off the output signal of the respective evaluation circuit. To this end, the voltage dividers preferably have at least two resistors, in particular ohmic resistors, connected in series. The node points are arranged between the individual resistors. The voltage divider can also be formed from other voltage drop-producing components. The taps of the respective voltage dividers form the output terminals of the evaluation circuits. In an alternative embodiment, the evaluation circuits each have one current divider which comprises the node points. The current dividers can be formed from a parallel connection of resistors.

In addition, the circuit arrangement has contact surfaces for contacting the contact means to the node points of the evaluation circuits. The contact surfaces and the contact means are preferably each formed of a suitable contact material, which has a sufficiently high electrical conductivity and/or a correspondingly low contact resistance for the intended evaluation. Using the contact means, at least one of the first contact surfaces and thus the first node point of the first evaluation circuit, which is connected to the at least one first contact surface, can be connected to the reference potential. Alternatively or additionally, using the contact means, at least one of the second contact surfaces and thus the second node point of the second evaluation circuit, which is connected to the at least one second contact surface, can be connected to the reference potential. The reference potential can be a ground potential, for example.

If the switching state or the switch position of the actuating element is now changed, the position of the contact means is also changed. Due to the change in position of the contact means, for example, a number or a configuration of the voltage drop-producing components, which are connected to each other and to the reference potential, of the first voltage divider and/or a configuration of the voltage drop-producing components, connected to each other and to the reference potential, of the second voltage divider, can be changed. In other words, via the first node point which is connected via the movable contact means to the reference potential, a number of voltage drop-producing elements of the first voltage divider corresponding to the switching state of the actuating element can be connected to the reference potential and/or via the second node point which is connected via the movable contact means to the reference potential, a number of voltage drop-producing components of the second voltage divider corresponding to the switching state of the actuating element can be connected to the reference potential.

A change in the configuration of the voltage drop-producing components of the first voltage divider also causes a first output signal of the first evaluation circuit to change. In the same way, any change to the configuration of the voltage drop-producing components of the second voltage divider causes a second output signal of the second evaluation circuit to change. The first and second output signals can be evaluated and in the activated state of the evaluation circuits can be assigned to a corresponding switching state.

It can be provided that a first switching state or a first group of switching states is detected only by the first evaluation circuit and a second switching state or a second group of switching states is detected only by the second evaluation circuit. For example, in the case of a direction indicator the first evaluation circuit can only detect switching states which are associated with a first travel direction, and the second evaluation circuit can only detect switching states associated with a second travel direction. In the presence of the first switching state or a switching state from the first group, in particular, only the voltage drop-producing components of the first voltage divider that correspond to the switching state are connected to each other and to the reference potential. Only the first output signal of the first evaluation circuit therefore changes. In the presence of the second switching state or a switching state from the second group, on the other hand, in particular only the voltage drop-producing components of the second voltage divider that correspond to the switching state are connected to each other and to the reference potential. Only the second output signal of the second evaluation circuit therefore changes.

It can also be provided, however, that each switching state is detected by both evaluation circuits. Thus, in the case of the direction indicator, each evaluation circuit detects the switching states which are associated with both directions. In this case, therefore, in each switching state both output signals change. A high degree of redundancy is thereby already achieved, as, for example, a switching state detected by the first evaluation circuit can be checked and/or verified by means of the second evaluation circuit.

Problems arise, however, when node points of the evaluation circuits are connected permanently to a voltage-carrying part, for example, due to a short circuit or a soft short-circuit, hereafter referred to as shorts. Such a live part can also be a node point of the respective other evaluation circuit. It can then happen that, due to the connection of one of its nodes to the live part, an evaluation circuit outputs an incorrect output signal. This output signal can correspond incorrectly, for example, to another switching state of the actuating element than that which is actually present, so that the output signal is misinterpreted.

In order to be able to diagnose such a fault, the evaluation circuits can be switched separately from each other and/or switched independently of each other. For example, the circuit arrangement has at least two devices for separately switching a power supply of the evaluation circuits, wherein a first of the devices is designed to switch the energy supply of the first evaluation circuit and wherein a second of the devices is designed to switch the energy supply of the second evaluation circuit. If, for example, an evaluation circuit is switched on, it is operated in a detection mode in which the evaluation circuit can detect the switching state. If, for example, an evaluation circuit is switched off, it is transferred into a diagnostic mode. In this diagnostic mode, in the error-free case the deactivated evaluation circuitry should output a defined output signal, for example, an output voltage of 0 V. If, however, a different output signal from this is output by the evaluation circuit when in the diagnostic mode, this indicates an error, for example, that one of the node points is connected to a live part via a short circuit or a low-ohmic parasitic resistance. In this case one evaluation circuit can be switched off, for example, and a different evaluation circuit switched on, so that the circuit arrangement can detect the switching state of the actuating element and perform the fault diagnosis at the same time.

The ability of the evaluation circuits to be switched provides the advantage that the circuit arrangement is designed for self-diagnosis and the circuit arrangement thus has a particularly secure design. Thus, faults within the circuit arrangement can be detected particularly easily and reliably, which means that the actual switching state of the actuating element can be determined.

The circuit arrangement preferably has at least one processing unit, which is designed to evaluate the output signals of the evaluation circuits, and at least one control unit, which is designed to switch the evaluation circuits separately from each other. In this process, a processing unit can be provided with at least two analogue inputs which are electrically connectable to a respective tap of the at least two evaluation circuits. It can also be provided however, that a number of processing units corresponding to the number of evaluation circuits is provided, so that one processing unit is electrically connected to one evaluation circuit in each case. Thus, a particularly high degree of security in the determination of the actuating element position can be achieved, since even one-off faults in one of the processing units can be detected. The at least one control unit is designed to switch the evaluation circuits, for example, by switching the corresponding energy supplies. For example, predetermined switching cycles for the control unit may be stored, which implements these, in particular within a measuring cycle for the detection of a switching state.

The circuit arrangement for switching the evaluation circuits has at least two switchable energy sources to provide an energy supply for the evaluation circuits, wherein the first evaluation circuit is electrically connected to a first of the switchable energy sources and the at least one second evaluation circuit is electrically connected to a second of the switchable energy sources. The switchable energy sources can be, for example, switchable voltage sources or switchable current sources. For this purpose, the evaluation circuits are connected to the respective switching power source via a respective first terminal. Respective second terminals of the evaluation circuits are connected to a reference potential. The reference potential can be, for example, the ground potential or another defined potential. By means of the switchable energy sources, the evaluation circuits can be switched on and off in a particularly simple manner.

As an alternative, it is also possible to provide two separate switches for the respective evaluation circuits, wherein the two separate switches are connected to one and the same energy source.

In an extension of the invention the voltage dividers are each connected via a respective series resistor to an energy source designed as a switchable voltage source to provide a supply voltage for the evaluation circuits, or the voltage dividers are each directly electrically connected to an energy source designed as a switchable current source. The series resistor is a so-called pull-up resistor. By means of the resistors connected to the voltage divider, depending on the actuating element position of the actuating element an output voltage that depends on the actuating element position is applied across the tap, which can be evaluated and assigned to the corresponding actuating element position particularly simply.

It can also be provided that the circuit arrangement has at least two controllable switching devices for switching the evaluation circuits, wherein the first evaluation circuit is electrically connected to a first of the controllable switching devices for switching the first evaluation circuit to a supply terminal, and the at least one second evaluation circuit is electrically connected to a second of the controllable switching devices for switching the second evaluation circuit to a supply terminal. Such a controllable switching device can be a semiconductor switch, for example. For example, the first terminals of the evaluation circuits can be connected to a first supply terminal and the second terminals of the evaluation circuits can be connected to a second supply terminal. The first supply terminal can be connected to an energy source, so that a supply voltage is applied at the first supply terminal. The second supply terminal can be connected to a reference potential, for example to ground. It can also be provided that each evaluation circuit is connected via the first terminals to a separate first supply terminal with a separate energy source. One of the two supply connections, i.e. the first or the second supply terminal, can be switched to the evaluation circuits via the respective switching device. In other words, the evaluation devices can be connected separately either to the supply terminal with the energy source or to the supply terminal with the reference potential.

Preferably, the circuit arrangement has a number of first contact surfaces corresponding to a number of switching states to be detected and a number of second contact surfaces corresponding to the number of switching states to be detected. In other words, the number of first contact surfaces and the number of second contact surfaces corresponds in each case to the number of switching states of the actuating element to be detected. These first and second contact surfaces are arranged in particular in such a way that in each switching state a first and a second contact surface are electrically connected to the reference potential via the movable contact means. According to this embodiment, each switching state of the actuating element can be detected by both evaluation circuits, situated in the activated state, which in an advantageous manner results in a high degree of redundancy in the evaluation of the switching state being achieved.

In an advantageous extension of the invention the movable contact means is designed as a multi-pole bridge, which is designed to electrically connect at least one of the first contact surfaces and/or at least one of the second contact surfaces to the reference potential depending on the switching state of the actuating element. In particular, the multi-pole bridge has three poles, wherein depending on the switching state of the actuating element a first pole is electrically connectable to one of the first contact surfaces, a second pole is electrically connectable to a reference potential surface connected to the reference potential, and a third pole is electrically connectable to one of the second contact surfaces The contact means can be moved back and forth between different switching states, for example, linearly or on a circular path. Due to the movement of the contact means, depending on the position of the contact means at least a first and/or at least a second contact surface are electrically connected to the reference potential via the multi-pole bridge. As a result, depending on the switching state, different node points of the respective evaluation circuit connected to the respective contact surfaces are connected to the reference potential. In particular, the second pole of the multi-pole bridge is permanently connected to the reference potential surface.

In addition, it would be also alternatively be possible to implement the multi-pole bridge in two parts. That would mean that the movable contact means can have, for example, two two-pole bridges so that the contact surfaces of the first and second evaluation circuit can be connected to different reference potential surfaces. The different reference potential areas may have different or identical reference potentials.

It proves to be advantageous if the first and second contact surfaces are arranged in columns along a travel path of the moving contact means and, in particular, on a common circuit substrate, wherein in a first column first and second contact surfaces are arranged alternately and in a second column second and first contact surfaces are arranged alternately. In particular, on the common circuit substrate between the first and the second column a reference potential surface extending along the travel path and connected to the reference potential is arranged as a third column. The circuit substrate can be, for example, a printed circuit board or PCB, on which the contact surfaces and the reference potential surface can be arranged in the form of electrically conductive surfaces or "pads". Via conductor tracks the first and second contact surfaces can be permanently electrically connected to the node points of the corresponding evaluation circuit. The reference potential surface formed across the travel path can be permanently contacted to the second pole of the movable contact means. Such contact surfaces can easily be arranged on circuit substrates, wherein the circuit substrates particularly and can be produced cost-effectively in large unit quantities.

The arrangement of the contact surfaces in columns, in particular with the reference potential surface, results in a block-shaped arrangement of the contact surfaces and of the reference potential surface. The column-wise arrangement is to be understood here to mean the arrangement of the contact surfaces along a respective line, wherein the line extends along the travel path of the movable contact means. Thus, the row-by-row arrangement of the contact surfaces and the reference potential surface is of course also possible in the case of a contact means moving horizontally, or the arrangement of the contact surfaces and the reference potential surface on circular paths in the case of a contact means moving along a circular path.

In these cases, the reference potential surface is located in particular between the contact surfaces of the first column and the contact surfaces of the third column. The first and second contact surfaces of the first and third column are arranged alternately, wherein the first and the second contact surfaces in the first and third column are arranged to run in opposite directions. This means that in a first line of the block-shaped arrangement, for example, a first contact surface, a portion of the reference potential surface and a second contact surface are arranged. In a subsequent second line a second contact surface is first arranged, followed by a portion of the reference potential surface and a first contact surface, etc. This will prevent two contact surfaces associated with the same evaluation circuit from being arranged next to each other, thus mechanically adjacent to each other. In other words, two first contact surfaces are always locally separated from each other by a second contact surface and/or the reference potential surface. This produces the advantage that no difficult to detect shorts can occur between two contact surfaces of the same evaluation circuit.

Short circuits between a first contact surface and a second contact surface, which are possible in the alternating arrangement of the first and second contact surfaces but are advantageously able to be diagnosed by means of the switchable evaluation circuits. This is because the contact surface of the deactivated evaluation circuit which is affected by the short circuit is connected to the activated, and therefore live, evaluation circuit. This connection is detectable or identifiable on the basis of the output signal of the deactivated evaluation circuit. The first evaluation circuit can be arranged next to the first column, for example, and the second evaluation circuit next to the third column. This means that the evaluation circuits are arranged on opposite sides of the block that has the three columns.

The evaluation circuits can be arranged to run in opposite directions. This means that, for example, the first contact surface in the first line of the block is connected to a first of the first node points of the first evaluation circuit, whereas the second contact surface in the first row, on the other hand, is connected to a last of the second node points of the second evaluation circuit, etc.

In order now to electrically connect the first contact surfaces of the third column to the corresponding first node points of the first evaluation circuit and the second contact surfaces of the first column to the corresponding second node points of the second evaluation circuit, appropriate conductor tracks can be routed using "vias", or plated-through contacts, to a rear side of the circuit substrate or to an intermediate layer of a multilayer circuit substrate, in order to be routed from there to the corresponding evaluation circuit. Thus the circuit arrangement can be arranged on the circuit substrate in a particularly space-saving and compact manner.

The invention relates to a method for operating a circuit arrangement according to the invention. In the method, during the detection of the switching state of the actuating element at least two switching cycles of the circuit arrangement are carried out. In a first switching cycle the first evaluation circuit is switched on and the second evaluation circuit is switched off. A first output signal is detected by the first evaluation circuit and a second output signal is detected by the second evaluation circuit. In a second switching cycle the first evaluation circuit is switched off and the second evaluation circuit is switched on. A third output signal is detected by the first evaluation circuit and a fourth output signal is detected by the second evaluation circuit. The switching state is determined on the basis of the four output signals.

The first and the fourth output signal are thus detected in an acquisition mode of the activated evaluation circuits and in that case are the output signals on the basis of which the switch position of the actuating element can be evaluated. The second and third output signal are detected in the diagnostic mode of the deactivated evaluation circuits. On the basis of the second and third output signal the evaluated switch position can be checked or verified, by these output signals being evaluated to provide a fault diagnosis so that, for example, short-circuits between the contact surfaces of a column can be detected. For example, it can be assumed that a fault, for example in the form of a short-circuit, is present in the circuit arrangement if the second and/or third output signal have an output voltage which is different from 0 V.

In an advantageous extension, to detect the switching state of the actuating element at least one third switching cycle is carried out, in which the first and the second evaluation circuit are switched on at the same time, wherein a fifth output signal is detected by the first evaluation circuit and a sixth output signal is detected by the second evaluation circuit, wherein the switch position is determined on the basis of the six output signals. The simultaneous activation of the evaluation circuits should be understood to mean that the evaluation circuits are switched on together, at least over a period of the acquisition of the respective output signals on the evaluation circuits. The third switching cycle is preferably carried out temporally prior to the first and the second switching cycle. The third switching cycle can be used, for example, as a pure measurement cycle for rapidly detecting the switching state. This allows the switching state to be evaluated on the basis of the fifth and sixth output signal. The switching state can be verified by comparing the fifth and sixth output signal to check whether both output signals are indicating the same switching state. If yes, this can be communicated, for example, to a vehicle-mounted control device. The control device can then generate a corresponding signal, for example, the blinking signal corresponding to the position of the switch. The first and the second switching cycle can then be carried out in order to perform a fault diagnosis in the circuit arrangement by separate deactivation of the evaluation circuits.

Preferably, in order to check the switch position a three-stage validation cycle is executed, wherein in a first stage, each output signal is validated separately, in a second stage the output signals corresponding to each other of the at least two evaluation circuits are compared with each other and validated, and in a third stage the output signals of the respective switching cycles are compared with each other and validated. In the first stage, the individual output signals are evaluated separately to each other, i.e. independently of each other. This means that, for example, a check is made as to whether the first, fourth, fifth and sixth output signal, which were detected in the activated states of the evaluation circuits, taken individually, have plausible signal values which correspond to a valid switch position. In addition, it is checked in particular whether the second and third output signal, which were detected in a deactivated state of the evaluation circuit, indicate a fault, for example if at least one of these output signals differs from 0 V by more than a predetermined threshold.

In the second stage, the mutually corresponding output signals are compared. In particular, the first and the fourth and the fifth and the sixth output signal are compared with each other to verify that these output signals indicate the same switch position. The output signals of the at least two evaluation circuits are thus evaluated against each other.

In the third stage, the output signals of the different switching cycles are compared with each other. It is thus compared whether the respective evaluation circuit has roughly the same output signals in the switching cycles in which it was turned on. For this purpose, for example, the first and the fifth and then the fourth and the sixth output signal are compared with each other.

This three-stage procedure can be used to check particularly reliably whether the evaluated switching state corresponds to the actual switching state. This is particularly advantageous in safety-critical applications. The procedure therefore enables a high level of security in the evaluation of the switching states of the actuating element.

A switching device according to the invention comprises a circuit arrangement according to the invention and an actuating element, the actuating element being connected to the movable contact means of the circuit arrangement. The actuating element and the contact means are in particular mechanically connected and can be moved together. The switching device can be arranged in particular in a motor vehicle, for example, to form a steering column switch of the motor vehicle.

The preferred embodiments presented in relation to the circuit arrangement according to the invention and their advantages apply mutatis mutandis both to the method according to the invention and to the switching arrangement according to the invention.

Additional features of the invention arise from the claims, the figures and the description of the figures. The features and feature combinations cited in the description above, and the features and feature combinations cited in the description of the figures below and/or shown in the figures alone are applicable not only in the respective combination indicated but also in other combinations or in isolation, without departing from the scope of the invention. Therefore, such embodiments of the invention are also to be considered as comprised and disclosed as are not explicitly shown or explained in the figures, but which emerge from and can be generated from the embodiments described by separate feature combinations. Embodiments and combinations of features, which do not have all features of an originally formulated independent claim, are therefore also to be regarded as disclosed. Furthermore, designs and combinations of features, in particular those of the designs described above, which go beyond or differ from the feature combinations set out in the cross-references of the claims shall also be considered to be disclosed.

Figure 2:
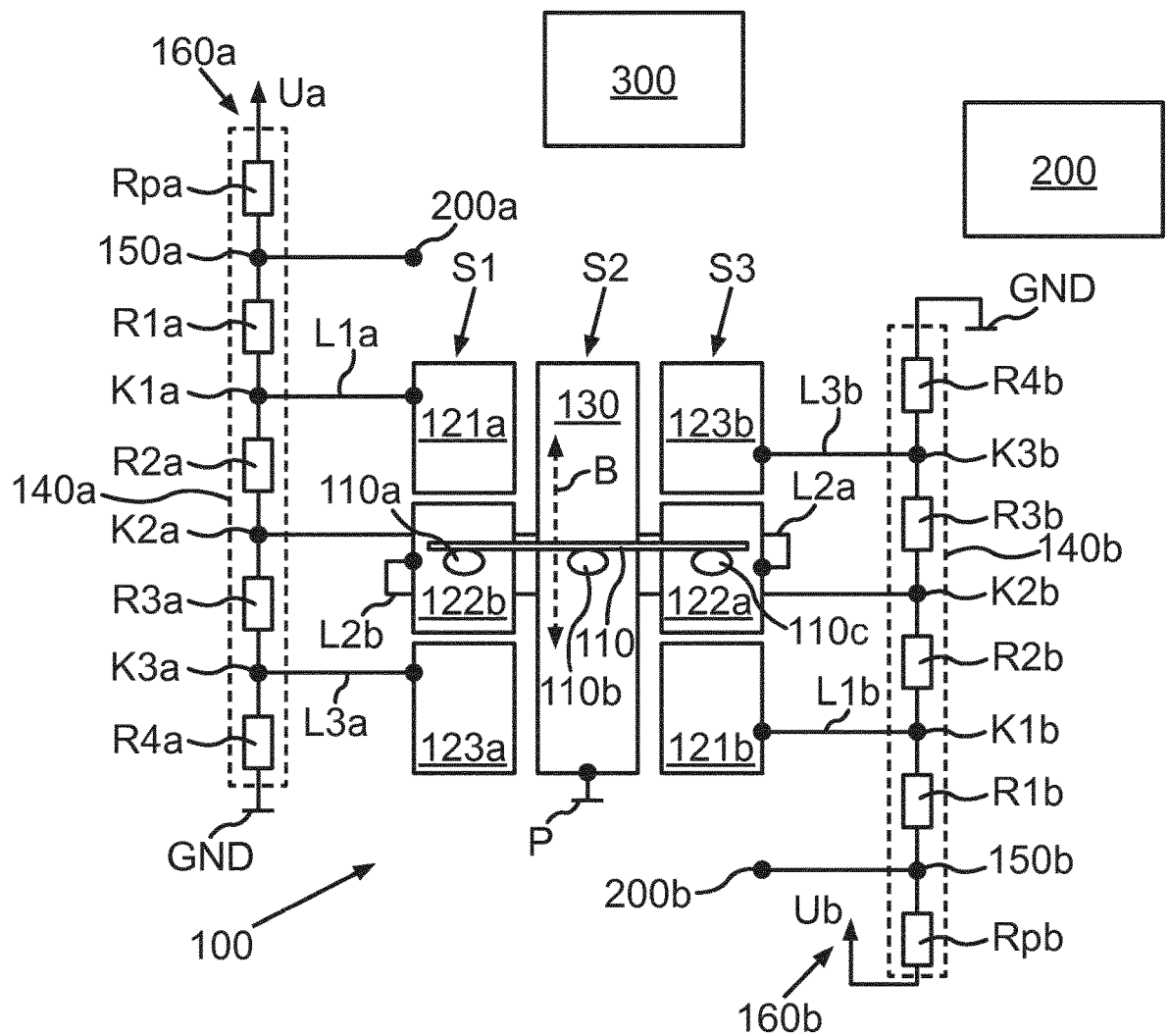
Figure 3:
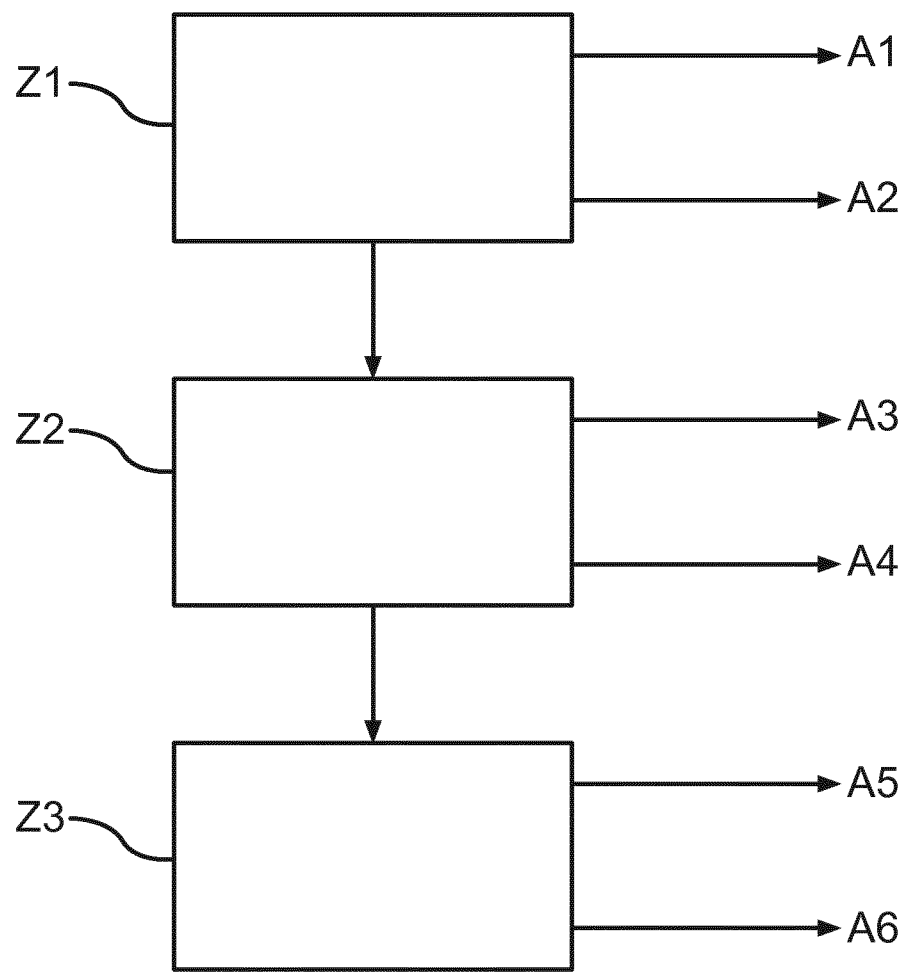

These show:

FIG. 1 a schematic drawing of a first embodiment of a circuit arrangement according to the invention;

FIG. 2 a schematic drawing of a second embodiment of a circuit arrangement according to the invention;

FIG. 3 a schematic representation of a sequence of switching cycles during detection of a switching state of an actuating element associated with the circuit arrangement.

In the figures, identical and functionally equivalent elements are indicated by identical reference symbols.

FIG. 1 and FIG. 2 each show a circuit arrangement 100 which is used to evaluate different switching states of an actuating element, which is not shown here. The actuating element can be, for example, a steering column switch of a motor vehicle, not shown here, which can be operated by a driver of the motor vehicle. For example, the steering column switch can be used to indicate a direction of travel, in particular to activate a turn indicator. Via a position or state of such an actuating element the driver specifies a desired direction of travel which is to be visualized by the subsequent activation of a corresponding turn indicator of the motor vehicle. Also, the steering column switch can be used for actuating a windscreen wiper system of the motor vehicle.

FIG. 1 shows a circuit arrangement 100, by means of which five switching states of the actuating element can be detected. For example, a first switching state corresponds to an intended left turn, which is to be visualized by a continuous flashing of the left turn indicator during the turning manoeuvre. A second switching state corresponds to an intended lane change to the left, which is to be visualized by a brief flashing of the left turn indicator. A third switching state corresponds to a neutral state, in which no flashing signal is to be output. A fourth switching state corresponds to an intended lane change to the right, which is to be visualized by a brief flashing of the right turn indicator. A fifth switching state corresponds to an intended right turn, which is to be visualized by a continuous flashing of the right turn indicator during the turning manoeuvre. FIG. 2 shows a circuit arrangement 100, by means of which three switching states of the actuating element can be detected. The three switching states correspond, for example, to different strengths or speeds of a wiping function of the windscreen wiper system.

To evaluate the switching state, the circuit arrangement 100 here has two evaluation circuits 140a, 140b, which are designed here in the form of voltage dividers. However, it is also possible to provide more evaluation circuits. In a first evaluation circuit 140a in accordance with FIG. 1 six first resistors R1a, R2a, R3a, R4a, R5a, R6a are connected in series, wherein between the first resistors R1a to R6a first node points K1a, K2a, K3a, K4a, K5a are arranged. In a second evaluation circuit 140b six second resistors R1b, R2b, R3b, R4b, R5b, R6b are connected in series, wherein between the second resistors R1b to R6b second node points K1b, K2b, K3b, K4b, K5b are arranged. The evaluation circuits 140a, 140b are electrically connected to a reference potential, here the ground terminal GND. The series circuit formed by resistors R1a, R2a, R3a, R4a, R5a, R6a of the first evaluation circuit 140a is connected via a first series resistor Rpa to a first supply voltage Ua. The series circuit formed by second resistors R1b, R2b, R3b, R4b, R5b, R6b of the second evaluation circuit 140b is connected via a second series resistor Rpb to a second supply voltage Ub.

Between the series circuit of the first resistors R1a, R2a, R3a, R4a, R5a, R6a and the first series resistor Rpa a first tap 150a is located for tapping off a first output signal of the first evaluation circuit 140a. Between the series circuit of the second resistors R1b, R2b, R3b, R4b, R5b, R6b and the second series resistor Rpb a second tap 150b is located for tapping off a second output signal of the second evaluation circuit 140b. The first and second output signals can be detected via respective analogue inputs 200a, 200b of a processing unit 200 of the circuit arrangement 100 and evaluated. It can also be provided that the circuit arrangement 100 has a separate processing unit 200 for each evaluation circuit 140a, 140b.

A first output signal in the form of a first output voltage U1 at the first analogue input 200a evaluates in accordance with the voltage divider rule to $$U1 = Ua \cdot \frac{\sum_i Ria}{Rpa + \sum_i Ria}.$$

A second output signal in the form of a second output voltage U2 at the second analogue input 200b evaluates to $$U2 = Ub \cdot \frac{\sum_i Rib}{Rpb + \sum_i Rib}.$$

The output signals, i.e. the output voltages U1, U2, of the respective evaluation circuit 140a, 140b are therefore dependent on how many of the resistors R1a, R2a, R3a, R4a, R5a, R6a or R1b, R2b, R3b, R4b, R5b, R6b are connected in series with each other. In other words, the output voltages U1, U2 depend on how many of the node points K1a, K2a, K3a, K4a, K5A or K1b, K2b, K3b, K4b, K5b are connected to each other and/or to a reference potential P, which is preferably also the ground potential GND. To connect one of the node points K1a to K5a or K1b to k5b to the reference potential P the circuit arrangement 100 has a movable contact means 110, which is mechanically connected to the actuating element and can be moved together with the actuating element along a travel path of the actuating element. The movable contact means 110 here is designed as a multi-pole bridge. A movement B of the contact means 110, here a linear movement of the contact means 110 along a vertical direction, is indicated by a double arrow in FIG. 1 and FIG. 2. Along the travel path contact surfaces 121a, 122a, 123a, 124a, 125a, 121 b, 122b, 123b, 124b, 125b are also arranged. In this arrangement one of the first contact surfaces 121a, 122a, 123a, 124a, 125a is electrically connected in each case to one of the first node points K1a, K2a, K3a, K4a, K5a and one of the second contact surfaces 121b, 122b, 123b, 124b, 125b is electrically connected to one of the second node points K1b, K2b, K3b, K4b, K5b. In addition, the circuit arrangement 100 has a reference potential surface 130, which is connected to the reference potential P. The reference potential P can be the ground potential GND, for example.

The contact surfaces 121a to 125a, 121b to 125b and the reference potential surface 130 here are arranged in columns S1, S2, S3, for example, on a front side of a circuit substrate. In a first column S1 first contact surfaces 121a, 123a, 125a and second contact surfaces 124b, 122b are arranged alternately. A second column S2 is formed by the reference potential surface 130. In a third column S3 second contact surfaces 125b, 123b, 121 b and first contact surfaces 122a, 124a are alternately arranged. The first evaluation circuit 140a here is located to the left of the first column S1 on the circuit substrate, the second evaluation circuit 140b here is located to the right of the third column S3 on the circuit substrate. The first contact surfaces 121a, 123a, 125a of the first column S1 are connected via conductor tracks L1a, L3a, L5a to the respective first node points K1a, K3a, K5a of the first evaluation circuit 140a and the second contact surfaces 121b, 123b, 125b of the third column S3 are connected via conductor tracks L1b, L3b, L5b to the respective second node points K1b, K3b, K5b of the second evaluation circuit 140b, wherein the conductor tracks L1a, L3a, L5a, L1i b, L3b, L5b are arranged in particular on the front side of the circuit substrate. The first contact surfaces 122a, 124a of the third column S3 are connected via conductor tracks L2a, L4a to the first node points K2a, K4a of the first evaluation circuit 140a and the second contact surfaces 122b, 124b of the first column S1 are connected via conductor tracks L2b, L4b to the second node points K2b, K4b of the second evaluation circuit 140b, wherein the conductors L2a, L4a, L2b, L4b are routed, for example by means of vias, to a rear side or an intermediate layer of the circuit substrate and from there to the respective evaluation circuits 140a, 140b.

If the movable contact means 110, as illustrated in FIG. 1, is located in the third, neutral switching state, a first pole 110a of the movable contact means 110 contacts the first contact surface 123a, a second pole 110b of the contact means contacts the reference potential surface 130 and a third pole 110c of the contact means contacts the second contact surface 123b. As a result, in the first evaluation circuit 140a the first node points K1a, K2a, K3a and therefore the first resistors R1a, R2a and R3a are serially connected to each other and via the movable contact means 110 to the reference potential P. The first output voltage U1 is therefore given by $$U1 = Ua \cdot \frac{R1a + R2a + R3a}{Rpa + R1a + R2a + R3a}.$$

In addition, in the second evaluation circuit 140a the second node points K1b, K2b, K3b and therefore the second contact resistors R1b, R2b and R3b are serially connected to each other and via the movable contact means 110 to the reference potential P. The second output voltage U2 is therefore given by $$U2 = Ub \cdot \frac{R1b + R2b + R3b}{Rpb + R1b + R2b + R3b}.$$

In the first switch position, on the other hand, which is reached here via the movement B of the contact means 110 upwards in the vertical direction, the contact means 110 contacts the first contact surface 121a, the reference potential surface 130 and the second contact surface 125b. As a result, in the first evaluation circuit 140a the first node point K1a is connected via the movable contact means 110 to the reference potential P. The first output voltage U1 is therefore given by $$U1 = Ua \cdot \frac{R1a}{Rpa + R1a}.$$

In the second evaluation circuit 140a the second node points K1b, K2b, K3b, K4b, K5b and therefore the second resistors R1b, R2b, R3b, R4b, R5b are connected to each other and via the movable contact means 110 to the reference potential P. The second output voltage U2 is therefore given by $$U2 = Ub \cdot \frac{R1b + R2b + R3b + R4b + R5b}{Rpb + R1b + R2b + R3b + R4b + R5b}.$$

All other switch positions are to be determined in the same way. The positions of the actuating element in accordance with FIG. 2 will be determined likewise, wherein the respective evaluation circuits 140a, 140b here only have four series-connected resistors R1a, R2a, R3a, R4a, R1b, R2b, R3b, R4b in each case. Thus, in each switch position of the contact means 110 at each of the analogue inputs 200a, 200b an output voltage U1, U2 assigned to the respective switching state of the actuating element can be measured. On the basis of a value of the output voltages U1, U2 therefore, the switching state of the actuating element can be determined.

By the alternating arrangement of the first and second contact surfaces 121a to 125a, 121b to 125b in the first and third column S1, S3, and the separation of the first and third column S1, S3 by the second column S2, here two contact surfaces 121a to 125a, 121b to 125b which are connected to the same evaluation circuit 140a, 140b are never arranged side by side. A distance between the contact surfaces 121a to 125a, 121 b to 125b connected to the evaluation circuits 140a, 140b and the central reference potential surface 130 can be implemented by appropriate design, for example, significantly larger than a distance between the contact surfaces 121a to 125a, 121b to 125b connected to the evaluation circuits 140a, 140b. It can thus be ensured that no difficult to detect short circuit can occur between two contact surfaces 121a to 125a, 121 b to 125b of the same evaluation circuit 140a, 140b.

Here, however, a short circuit can occur between the contact surfaces 121a to 125a, 121 b to 125b of both evaluation circuits 140a, 140b. In order to detect such a fault, the circuit arrangement 100 is designed for fault diagnosis. For this purpose, the evaluation circuits 140a, 140b can be switched on and switched off separately. In an activated state, the relevant evaluation circuit 140a, 140b is designed to detect the switching state of the actuating element. In the deactivated state the relevant evaluation circuit 140a, 140b is designed for fault diagnosis. For example, in the activated state the first evaluation circuit 140a is connected to the supply voltage Ua and in the deactivated state it is disconnected from the supply voltage Ua. In the activated state the second evaluation circuit 140b is connected to the supply voltage Ub and in the deactivated state it is disconnected from the supply voltage Ub.

To this end the evaluation circuits 140a, 140b can have, for example, switchable voltage sources 160a, 160b, via which the respective supply voltage Ua, Ub is applied to the respective evaluation circuit 140a, 140b. The separately switchable voltage sources 160a, 160b can be controlled, for example, by a control unit 300 of the circuit arrangement 100. Alternatively, for example, a controllable switching device can be connected between the series resistor Rpa, Rpb and the respective supply voltage Ua, Ub or between the resistor R6a, R6b and the reference potential GND. It can also be provided that the series circuits R1a to R6a and R1b to R6b are each connected directly to a switchable current source.

In one example, the movable contact means 110 is in the third switch position shown in FIG. 1 and both supply voltages Ua, Ub—and thus both evaluation circuits 140a, 140b—are switched on. Now if a short, i.e. a short circuit or other parasitic, low-ohmic contact resistance, occurs between the first contact surface 121a and the second contact surface 124b in the first column S1, then a voltage difference between the two contact surfaces 121a and 124b will decrease (provided the difference was not already equal to zero due to matching resistors in the two evaluation circuits 140a, 140b). If a reduction of the voltage difference between the two contact surfaces 121a, 124b now occurs, this also leads to a change in the voltage ratios in the two evaluation circuits 140a, 140b. This in turn leads to a change in the respective output voltages U1, U2 at the analogue inputs 200a, 200b of the processing unit 200. In this case it may be the case that the change in the output voltages U1, U2 is either too low to reach a detection threshold, or for the change to lead to a plausible overall state at all. This means, for example, that the output voltages U1, U2 have a value, which while not corresponding to the voltage value of the actual switch position, nevertheless matches a voltage value that corresponds to a different switch position. The switch position is thus evaluated incorrectly.

If the supply voltage Ub at the second evaluation circuit 140b is now switched off, for example by the control unit 300, the voltage ratios change once again. The change in the first output voltage U1 at the first analogue input 200*a* can again be relatively low, for example. The change in the second output voltage U2 at the second analogue input 200*b* caused by the short, however, is large and easily detectable, because without the short the output voltage U2 in the deactivated condition of the supply voltage Ub would be equal to zero. Since a connection exists to the live first evaluation circuit 140*a* due to the short between the contact surfaces 121*a* and 124*b*, however, the second output voltage U2 is significantly different from zero. The same applies to the reverse case, thus if the supply voltage Ub is switched on and the supply voltage Ua of the first evaluation circuit 140*a* is switched off.

By appropriate selection of the resistors R1*a* to R6*a* and R1*b* to R6*b* it can be ensured that virtually all short circuits between adjacent contact surfaces 121*a* to 125*a*, 121*b* to 125*b* can be unambiguously detected, as long as the contact resistance caused by the short is small enough to be able to distort the evaluation in one of the possible switching states.

Preferably, on each detection of a switching state of the actuating element different switching cycles Z1, Z2, Z3 of the circuit arrangement 100 are carried out, as shown in FIG. 3. To this end, in a first switching cycle Z1 of the circuit arrangement 100 both evaluation circuits 140*a*, 140*b*, thus for example, both supply voltages Ua, Ub, are switched on. In this case a first output signal A1 is detected by the first evaluation circuit 140*a* and a second output signal A2 is detected by the second output circuit 140*b*. In a second switching cycle Z2 the supply voltage Ua is switched on and the supply voltage Ub is switched off, wherein a third output signal A3 is detected by the activated first evaluation circuit 140*a* and a fourth output signal A4 is detected by the deactivated second evaluation circuit 140*b*. In a third switching cycle Z3 the supply voltage Ua is switched off and the supply voltage Ub is switched on. A fifth output signal A5 is detected by the deactivated first evaluation circuit 140*a* and a sixth output signal A6 is detected by the activated second evaluation circuit 140*b*.

A three-stage verification cycle can now be executed. In a first stage, all output signals A1 to A6 are evaluated separately and independently of each other. This means here that a check is made as to whether the output signals A4, A5, which are used for fault diagnosis, are each either zero or different from zero by no more than a predetermined threshold value. The output signals A1, A2, A3, A6, which are used for detecting the switching state, are checked to determine whether they each have plausible voltage values which correspond to a possible valid switching state.

In a second stage, the output signals A1 to A6 of both evaluation circuits 140*a*, 140*b* are compared with one another. This means that, in particular, a check is made as to whether the first output signal A1 and the second output signal A2 are indicating the same switching state, i.e. whether the output voltage of the first output signal A1 and the output voltage of the second output signal A2 can be assigned to the same switching state. In addition, the third output signal A3 and the sixth output signal A6 are compared and checked to determine whether they indicate the same switching state.

In a third stage the results of the switching cycles Z1, Z2, Z3 are then compared with one another, thus to determine whether the first evaluation circuit 140*a* in its activated states and the second evaluation circuit 140*b* in its activated states both evaluate the same switching state. For this purpose, for example, the first output signal A1 and the third output signal A3 and then the second output signals A2 and the sixth output signal A6 are compared with each other. The switching state can therefore be determined in a particularly reliable way.

In doing so it can be provided that a tolerance period is specified, within which the result of the evaluation of the switching state should occur. If the processing unit 200 is designed to carry out the three stages of the validation within this tolerance period, then the switching state will not be determined until all three stages have been completed. Otherwise, for example, the first switching cycle Z1 can be carried out first, and the switching state can already be determined on the basis of this. The switching state determined there can then be communicated immediately. The second and third switching cycle Z2, Z3 can then be carried out. It is also possible, for example, to carry out only the second and third switching cycle Z2 and Z3.

The invention claimed is:

1. A circuit arrangement for evaluating at least two switching states of an actuating element, comprising:
   a moveable contact means which is connectable to the actuating element;
   a first evaluation circuit with a first voltage divider, which has first node points and a first tap for tapping off a first output signal of the first evaluation circuit;
   at least one second evaluation circuit with a second voltage divider, which has second node points and a second tap for tapping off a second output signal of the second evaluation circuit,
   first contact surfaces, which are each electrically connected to one of the first node points, and
   second contact surfaces, which are each electrically connected to one of the second node points,
   wherein via the movable contact means, depending on the switching state of the actuating element at least one of the first contact surfaces and/or at least one of the second contact surfaces are electrically connectable to a predetermined reference potential,
   wherein the evaluation circuits are switched on and off separately from each other,
   wherein the circuit arrangement is configured to detect the switching state of the actuating element on the basis of the output signal of a connected evaluation circuit and on the basis of the output signal of a deactivated evaluation circuit to carry out a fault diagnosis of the circuit arrangement.

2. The circuit arrangement according to claim 1, wherein the circuit arrangement has at least one processing unit which is configured to evaluate the output signals of the evaluation circuits, and the circuit arrangement has at least one control unit configured to switch the evaluation circuits separately from each other.

3. The circuit arrangement according to claim 1, wherein the circuit arrangement for switching the evaluation circuits has at least two switchable energy sources to provide an energy supply for the evaluation circuits, wherein the first evaluation circuit is electrically connected to a first of the switchable energy sources and the at least one second evaluation circuit is electrically connected to a second of the switchable energy sources.

4. The circuit arrangement according to claim 3, the voltage dividers are each connected via a respective series resistor to an energy source configured as a switchable voltage source to provide a supply voltage for the evaluation circuits, or the voltage dividers are each directly electrically connected to an energy source configured as a switchable current source.

5. The circuit arrangement according to claim 1, wherein the circuit arrangement has at least two controllable switching devices for switching the evaluation circuits, wherein the first evaluation circuit is electrically connected to a first of the controllable switching devices for switching the first evaluation circuit to a supply terminal, and the at least one second evaluation circuit is electrically connected to a second of the controllable switching devices for switching the second evaluation circuit to a supply terminal.

6. The circuit arrangement according to claim 1, wherein the circuit arrangement has a number of first contact surfaces corresponding to a number of switching states to be detected, and a number of second contact surfaces corresponding to the number of switching states to be detected.

7. The circuit arrangement according to claim 1, wherein the movable contact means is configured as a multi-pole bridge, which is configured to electrically connect at least one of the first contact surfaces and/or at least one of the second contact surfaces to the reference potential depending on the switching state of the actuating element.

8. The circuit arrangement according to claim 7, wherein the multi-pole bridge has three poles, wherein depending on the switching state of the actuating element a first pole is electrically connectable to one of the first contact surfaces, a second pole is electrically connectable to a reference potential surface connected to the reference potential, and a third pole is electrically connectable to one of the second contact surfaces.

9. The circuit arrangement according to claim 1, wherein the first and second contact surfaces are arranged on a common circuit substrate in columns that extend along a travel path of the movable contact means, wherein in a first column alternating first and second contact surfaces and in a second column alternating second and first contact surfaces are arranged.

10. The circuit arrangement according to claim 9, wherein on the common circuit substrate between the first and the second column a third column is arranged, which extends along the travel path and has a reference potential surface connected to the reference potential.

11. A method for operating a circuit arrangement according to claim 1, during the detection of the switching state of the actuating element at least two switching cycles is carried out, wherein
in a first switching cycle the first evaluation circuit is switched on and the second evaluation circuit is switched off, and a first output signal is detected by the first evaluation circuit and a second output signal is detected by the second evaluation circuit,
in a second switching cycle the first evaluation circuit is switched off and the second evaluation circuit is switched on, and a third output signal is detected by the first evaluation circuit and a fourth output signal is detected by the second evaluation circuit,
the switching state is determined on the basis of the four output signals.

12. The method according to claim 11, wherein during the detection of the switching state of the actuating element, at least one third switching cycle is carried out, in which the first and the second evaluation circuit are switched on at the same time, wherein a fifth output signal is detected by the first evaluation circuit and a sixth output signal is detected by the second evaluation circuit, wherein the switching state is determined on the basis of the six output signals.

13. The method according to claim 11, wherein, to check the switching state of the actuating element, a three-stage validation cycle is executed, comprising:
in a first stage, each output signal is validated separately,
in a second stage the output signals corresponding to each other of the at least two evaluation circuits are compared with each other and validated, and
in a third stage the output signals of the respective switching cycles are compared with each other and validated.

14. A switching device having an actuating element, and a circuit arrangement according to claim 1, the movable contact means of the circuit arrangement being connected to the actuating element.

* * * * *